Figure 1:
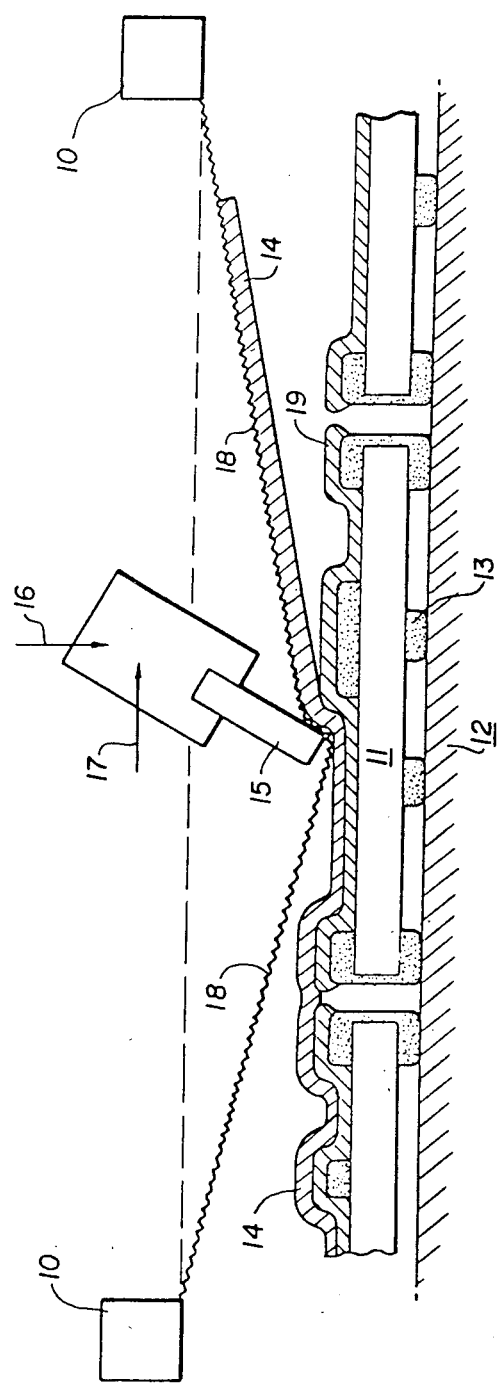

United States Patent [19]

Sullivan

[11] Patent Number: 4,556,627
[45] Date of Patent: * Dec. 3, 1985

[54] TRANSFERRING POLYMER FROM THIN PLASTIC FILMS TO PHOTODEVELOP INSULATION PATTERNS ON PRINTED WIRING BOARDS

[76] Inventor: Donald F. Sullivan, 115 Cambridge Rd., King of Prussia, Pa. 19406

[*] Notice: The portion of the term of this patent subsequent to Mar. 19, 2002 has been disclaimed.

[21] Appl. No.: 600,084

[22] Filed: Apr. 13, 1984

Related U.S. Application Data

[63] Continuation-in-part of Ser. No. 364,309, Apr. 1, 1982, Pat. No. 4,506,004.

[51] Int. Cl.[4] .......................... G03C 5/00; G03C 1/74
[52] U.S. Cl. .................................... 430/312; 430/257; 430/311; 430/319; 430/327; 430/394; 156/212; 156/230; 156/241; 156/574
[58] Field of Search ............... 430/257, 311, 312, 319, 430/327, 394, 252, 935; 156/212, 230, 241, 574, 235, 239

[56] References Cited

U.S. PATENT DOCUMENTS

| | | | |
|---|---|---|---|
| 3,629,036 | 12/1971 | Isaacson | 156/241 |
| 4,024,293 | 5/1977 | Hatzakis | 427/43 |
| 4,260,675 | 4/1981 | Sullivan | 430/315 |
| 4,332,873 | 6/1982 | Hughes et al. | 430/15 |
| 4,388,137 | 6/1983 | McCarty et al. | 156/275.5 |
| 4,424,089 | 1/1984 | Sullivan | 156/155 |
| 4,506,004 | 3/1985 | Sullivan | 430/312 |

OTHER PUBLICATIONS

Hughes, *Screen Printing of Microcircuits*, Dan Mar Publishing Co., New Jersey, 1967.

*Primary Examiner*—John E. Kittle
*Assistant Examiner*—José G. Dees

[57] ABSTRACT

Simplified clamshell type printed wiring board production apparatus employs a reusable thin flexible plastic film as a carrier for a photopolymer coating layer for covering part of the conductive layer of a printed wiring board with a photoproduced pattern of high resolution. For solder mask coatings, two superimposed layers of polymer with diverse characteristics are employed to give significant advantages of high resolution, low cost, less production time with unskilled labor, better adherence to bare copper conductors, better environmental and electrical properties, and low tooling costs, without problems of outgassing and without the necessity for heating and cooling cycles during lamination. Low cost liquid photopolymer coatings are used advantageously by screen transfer with a scanning squeegee in an air free bond over circuit traces of considerable thickness in the absence of a vacuum. Expensive phototools are protected from accumulation of dirt and wear by carrying polymer layers on the reusable thin plastic film, which also precludes the cost of disposable release sheet covers. Diverse characteristics in the respective superimposed polymer layers permits better adherence to bare copper and better solder mask coatings. Use of 100% solids polymers prevents outgassing problems. Use of liquid polymers permits air free surface contact over rough surfaces to avoid loss of resolution. Partial pre-exposure of the polymer layers before deposit on the wiring board provides better tenting capabilities and avoids thinning out over circuit traces.

11 Claims, 3 Drawing Figures

4,556,627

TRANSFERRING POLYMER FROM THIN PLASTIC FILMS TO PHOTODEVELOP INSULATION PATTERNS ON PRINTED WIRING BOARDS

This is a continuation-in-part of Ser. No. 364,309, filed Apr. 1, 1982, now U.S. Pat. No. 4,506,004, issued on Mar. 19, 1985.

TECHNICAL FIELD

This invention relates to the manufacture of printed wiring boards, and more particularly it relates to the patterning of polymer insulation layers onto a conductive film layer adhered to the printed wiring board insulating substrate.

Insulating coating patterns are affixed onto a portion of the thin film conductive layer during two stages of printed wiring board manufacture, namely, in primary imaging for the definition of the printed circuit wiring pattern to be etched into the conductive layer, and also for the provision of a solder mask to be affixed permanently over a selected part of the printed circuit wiring pattern. Photopolymer coatings have been used for photodeveloping such insulation patterns from phototool images of the desired insulation pattern.

In the prior art processes, however, there are several unsolved problems. A most significant drawback is the lack of high resolution in the absence of high cost materials and processes, partly due to the tendency to trap air bubbles under polymer coatings, particularly in the case of dry film type photopolymers over metal conductor circuit traces extending typically 0.003 in. (0.008 cm) to 0.004 in. (0.01 cm) above the substrate laminate. Furthermore a dry film photopolymer is expensive, typically four times the cost of a liquid photopolymer. Also the force and high temperature necessarily used in the prior art to force the dry film over the conductor traces will also force the film into the circuit through holes, where not all the polymer can be removed in a normal washout process, thereby undesirably leaving the holes plugged. The dry film simply does not conform to sharp corners, etc. and tends to pucker so that a smooth surface is not achieved. Another serious disadvantage is that the dry film polymers do not adhere well to bare copper conductors, thus usually requiring an extra manufacturing step of pretreatment with a black oxide coating or the like. Also the energy cost and processing time and equipment cost is seriously increased because the dry film polymers need be heated and cooled for lamination.

When dry film photopolymers are used, they conventionally have the additional cost of a release layer covering of polyester or polyolefin plastic film on both sides, which must be removed and scrapped. Objectives of this invention include removal of all the foregoing disadvantages of the prior art usage of dry film photopolymers.

Other prior art problems occur in the use of photopolymers, including liquid photopolymers. One is the starvation of liquid photopolymer on the surface of the wiring traces extending above the printed wiring board substrate surface. Another is the necessity of processing the application of the polymer coatings in expensive and cumbersome large vacuum chambers to avoid trapped air. In large scale quantity manufacture also, the continual use of expensive precision phototool images deteriorates their resolution and thus the pattern production quality because of the abrasiveness of the repeated polymer coatings, etc. In this respect the phototool cost may be high because of replacement of the phototools every few hundred manufacturing cycles.

Particularly when using liquid photopolymers, there is a problem of "tenting" or bridging over holes in the printed wiring board because of extrusion into the holes to thin out the polymer covering layer. Also liquid polymers are not readily controllable for providing films of uniform thickness when thicknesses become substantial, such as those necessary to provide adequate thermal and electrical insulation for use as solder mask coatings. Furthermore with available polymers of acceptable commercial cost, in many cases the properties are not ideal for the comprehensive range of printed circuit wiring board functions. For example, the consistency for tenting holes of a liquid polymer having good adherence to bare copper wiring may not be good. Likewise the best electrical insulator and heat absorbent polymer for solder masking may not adhere well, etc. A further quality control problem for use of polymers, and particularly dry film polymers after taking off a protective release plastic film is the presence of lint and dirt particles on both the printed circuit board surface and adhering to the uncovered surface of the polymer, which affect resolution of photo developed patterns.

Accordingly it is an objective of this invention to find solutions to the foregoing problems and to provide manufacturing processes using polymers in the formation of insulation patterns over portions of a printed wiring board conductive film layer that are efficient in time, equipment and cost, and particularly efficient in the cost of expendible resources such as time, plastic films and polymers, all with an unexpected increase in resolution and performance. Other objects, features and advantages of the invention will be found throughout the following description, drawings and claims.

DISCLOSURE OF THE INVENTION

This invention provides an improved method for manufacturing solder masks by placing two superimposed face to face constant thickness layers of polymers on the surface of the conductive film layer of a printed circuit wiring board. The inner layer is a liquid adhesive photopolymer chosen for adhesion directly to bare copper circuit board layers. The outer layer is preferably one of the following types of good solder masking polymers:

1. Dry film solder mask photopolymer.
2. UV-curable liquid solder mask photopolymer.
3. Dry epoxy non-imaging solder mask transfers.

The possible combinations of inner and outer layer polymers yield a wide range of composite coating characteristics, including: electrical performance, environmental reaction, printing placement accuracy, adhesion and cost. For preventing outgassing of solvents at molten solder temperatures, each of the layers is a pure 100% solid solvent free polymer of a substantial thickness, of the order of 0.002 in. (0.005 cm) to 0.004 in. (0.01 cm), as contrasted with the microthin solvent adhesion layer disposed between a thick dry film layer and the copper conductor layer in U.S. Pat. No. 3,629,036 issued Dec. 21, 1971 to Calvin Isaacson. This overcomes the aforesaid disadvantages and provides the very significant cost advantage of replacing an expensive thick dry film polymer layer with a thinner layer and a much less costly substitute layer of liquid polymer, or alternatively two liquid polymer layers, to achieve improved overall printed circuit advantages. Furthermore, for solder mask applications over the circuit trace wires, the thick liquid polymer layer affords good adhesion without air bubbles and can be applied at room temperature, whereas the prior art technique with dry film polymer requires heating and laminating into place at high pressure requiring significant extra energy, equipment and time delay cost for the requisite heating and cooling steps.

By use of a dry film outer polymer layer or a liquid film layer that is partly cured through an image pattern before lamination, good tenting properties are imparted to cover through holes without extrusion of the outer liquid polymer layer into the holes or unwanted blocking of holes from exposure of residual polymer. Also this provides from the low pressure mating with an inner liquid layer, the advantage of eliminating starvation or thinning of polymer over the conductor wires, where thickness is critical for solder masking.

The inner coating of liquid photopolymer is screen printed over the entire printed wiring board surface to coat both the circuit traces and the base laminate, thereby displacing all the air from the board surface and filleting the edges of the circuit traces. The outer dry film or partially hardened liquid layer is then laminated onto and mated with the liquid coating in air free surface to surface contact without the need for a vacuum laminator, heat or significant pressure. After mating the composite polymer layer is exposed to a strong UV radiation source through a photographic tool image pattern to harden or make insoluble light struck pattern areas sufficiently to withstand the subsequent solvent washout step for removing unhardened polymer. When the dry film layer is developable in an aqueous solution and the inner layer is developable in a different solvent then the undercutting of the inner layer can be reduced, since the removal of the soluble portions of the outer layer requires a longer time than the time required to remove the unhardened inner layer. As an example, the outer layer of aqueous developable dry film solder mask can be developed within one minute, while the unhardened inner layer can be developed in 20 seconds, and during the one minute period of outer layer development, the inner layer is not being affected and no undercutting takes place. The second developer solvent can then be used to remove the unhardened liquid inner layer with no adverse effects on the outer layer. A second exposure curing step bonds the two layers together and to the printed wiring board for permanent positioning thereon.

If the outer layer is a non-imaging dry epoxy coating carried on a thin transparent sheet, then the procedure is to apply the coating to the transparent sheet in the liquid state by screen printing the desired image pattern, then curing to a semi-cured state, and then laminating to the liquid coating. When the inner layer is exposed to a light source through the outer coating and through an image bearing transparency phototool, then the inner layer thus exposed bonds the epoxy outer layer thereto. Unexposed inner layer photopolymer is washed out in a solvent and the composite mask is completed by a final curing step.

In order to provide precise resolution and registration of polymer patterns overlying part of the printed wiring board copper conductor layer for environmental protection, insulation and solder masking without extensive phototool and equipment cost, simple and effective apparatus is afforded for making printed wiring boards.

One unique feature of this equipment is its separation of the polymer from direct contact on the image surface of a precision glass phototool, to increase its life without reduction of the precision reproduction of the polymer patterns. Thus surprisingly the outer polymer layer may be coated on and carried by a thin flexible plastic film without dimensional stability, such as a polyester or polyolefin that releases the polymer readily. In this manner a nonprecision low-cost thin carrier film can be repeatedly used over and over while preserving the integrity of the precision phototool image thereby to realize the necessary precision and resolution over long time periods.

Thus a thin plastic carrier film is tautly held in a frame that constitutes an intermediate one of three pivotable panels of a clamshell type fixture. The outer two panels respectively are a precision transparent phototool panel with the desired pattern imaged thereon and a printed wiring board carrier panel, all commonly hinged for relative rotation and precision mating.

In the manufacturing process, the inner polymer layer may be screened directly onto the printed wiring board. The outer polymer layer may be screened directly onto the taut plastic film on the side rotatable to move the polymer layers face to face without actually making surface contact so that a rubber squeegee blade drawn across the plastic carrier film outer surface will transfer and release the outer polymer layer carried thereon onto the inner liquid polymer layer in air free contact. Both outer clamshell panels may be laid flat on a work table for these steps. The outer polymer layer is disposed on the carrier film so that it may be preexposed through the phototool image pattern with the clamshell outer panels open, and subsequently exposed with the clamshell panels closed simultaneously with the inner layer by radiation passing through the phototool image.

Other features and advantages of the invention will be discussed in more detail hereinafter.

THE DRAWINGS

Figure 2:
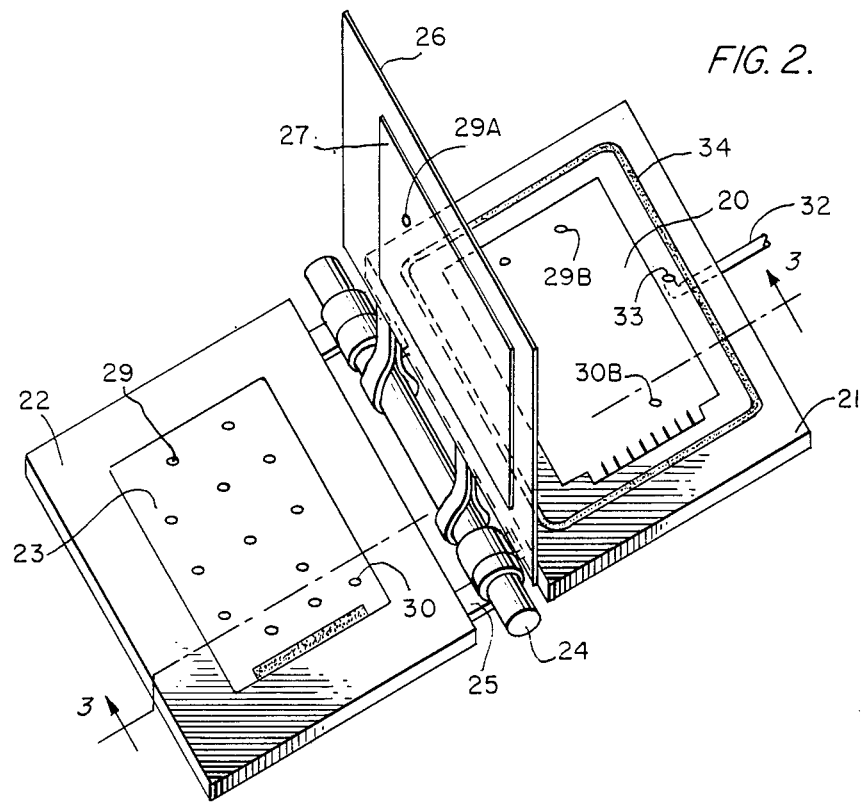
Figure 3:
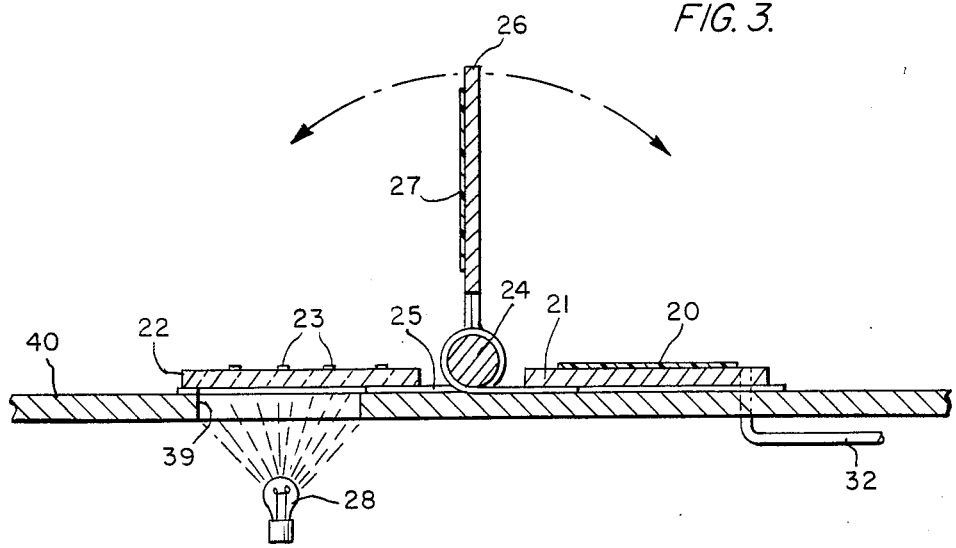

In the drawings:

FIG. 1 is a sectional cut-away view showing the lamination apparatus as a coated board has an inner polymer layer laminated with an outer polymer layer, FIG. 2 is a perspective view of a clamshell fixture, afforded by this invention for depositing two polymer layers on a printed wiring board in a predetermined pattern, and FIG. 3 is an end section view of the fixture of FIG. 2 resting on a table surface as taken along lines 3—3.

THE PREFERRED EMBODIMENTS

Polymers that have appropriate physical and electrical characteristics for use as solder mask materials on printed circuit wiring boards include screen-printed non-photo imaging epoxies, screen-printed UV-curable photopolymers and dry film solder masks. Dry film has poor adhesion properties to the copper conductor layer of the printed wiring boards. Screen printed epoxy has poor printing resolution as do screen printed UV-curable photopolymers. Dry film costs as much as six times as much as the other materials and takes up to five times as long to process in much more expensive equipment. Screen printing takes highly skilled technicians.

The present invention provides a composite two layer solder mask that can be photoprocessed in situ for high resolution, can be processed in less time with unskilled labor, has excellent adhesion properties, environmental and electrical characteristics and greatly reduces the cost of materials and equipment when compared with prior art dry film solder mask techniques.

The present invention has further advantages in that two layers can each have differing properties to suit a particular solder mask layer requirement. The inner liquid photopolymer layer permits air bubble free lamination over relatively thick and closely spaced printed wiring traces with very inexpensive processing equipment. Typically a dry film 0.003 in. (0.008 cm) thick can be replaced with a composite of 0.001 in. (0.0025 cm) thick dry film outer layer and 0.001 in. (0.0025 cm) thick inner liquid photopolymer layer, with the superior performance and lower cost characteristics hereinbefore described.

The invention is therefore directed to a solder mask having a composite two layer polymer coating pattern over selected portions of the conductive layer of a printed circuit wiring board, wherein the inner layer is a liquid photopolymer coating of 100% solids and the outer layer is a compatible polymer transferred thereupon from a thin flexible plastic carrier sheet, and wherein a desired pattern is photoprocessed to produce the composite coating pattern secured in place for masking a portion of the copper layer on the printed wiring board. The basic liquid polymers used in this invention have a range of viscosity from a fluid to a heavy paste consistency as commercially available for use in screen printing, roller coating and curtain coating.

In one embodiment a dry film photopolymer outer layer may be deposited on a liquid photopolymer inner layer. Thus, a printed wiring board having the conductive copper layer in the form of circuit traces extending 0.004 in. (0.01 cm) high from the substrate surface, has deposited thereover a liquid polymer coating 0.001 in. (0.0025 cm) thick as transferred from a polyester or "Nylon" screen printing fabric of 125 mesh in the manner shown in FIG. 1. The liquid polymer is preferably type 311 LV, manufactured by M & T Chemicals, Inc. of Rahway, N.J., which gives good adhesion properties to bare copper without intermediate processing of the copper surface, is 100% solids and does not outgas during curing.

The outer dry film solder mask layer 0.001 in. (0.0025 cm) thick is laminated to the liquid polymer coated printed wiring board as shown in FIG. 1. Thus, typically Dupont VACREL dry film with a polyolefin liner film is temporarily adhered to the underside of a screen printing frame having a 235 mesh fabric with the liner film held in contact with the screen mesh by a temporary adhesive such as 3M "Spray Mount" adhesive.

The outer dry film layer is then spaced slightly from the inner liquid layer and laminated thereonto by drawing the squeegee blade the length of the board across the top side of the screen fabric as shown in FIG. 1. This step forces the dry film into intimate face to face contact with the liquid polymer film in such a way that no air is trapped.

The composite coating is then exposed to UV radiation through a suitable phototool pattern to produce in-situ the wanted polymer pattern with high resolution, permitting wash out of unwanted polymer with a suitable solvent solution. The retained pattern then may be finally cured for assured bonding into a composite layer exhibiting the solder mask qualities desired.

In FIG. 1, the printed wiring board 11 has metal conductors 13 adhered to the substrate surface of the board 11 and resting on the support surface 12. The frame 10 restrains and tensions the polyester fabric screen 18. The inner liquid polymer layer 19, previously deposited on the surface of board 11 in the same way, is covered by the outer polymer layer, such as the dry film hereinbefore described, by drawing squeegee blade 15 under forces 16 and 17 which scan the board 11 with enough pressure to force photopolymer layer 14 into air free contact with the liquid polymer layer 19. The composite covering 14, 19 is then moved to a radiation site and exposed through a phototool image to produce a pattern of hardened polymer and the unhardened portions of both layers 14 and 19 are washed out in a solvent such as trichloroethane spray for a period of two minutes.

Final cure of the composite film is accomplished by exposure to a strong UV radiation such as provided by a conveyorized curing unit having two 200 watt per linear inch capacity when moved at a speed of five feet per minute.

In an embodiment with two liquid polymer layers, with high resolution photo reproduction, it is preferable to press the phototool image plate into intimate contact with the liquid polymer during the exposure cycle. When the paste consistency liquid photopolymer is covering wiring traces or other highly irregular surface topology, there is a problem of photopolymer starvation or thinout over the traces, since downward pressure on the phototool forces the photopolymer to extrude sideways and off the conductors.

This starvation is prevented by forming the outer layer on the surface of an image bearing photomask as a deposit of a thickness of about 0.001 in. (0.0025 cm) and exposing the layer through the photomask to partially harden the polymer layer. Then the photomask is mated onto the inner coating over the printed wiring board in register so that the phototool pattern areas are positioned over the circuit conductor pads which are to be free of hardened solder mask. The partially hardened photopolymer does not extrude from the top of the conductors.

An alternative method to prevent photopolymer thin out or starvation from the top surface of narrow traces is to contour the underside of the phototool in a pattern complementary to the printed wiring patterns, so that when mated the printed wiring conductors are enveloped by the contoured surface, and the photopolymer on top of the narrow traces is not forced to extrude sideways.

As may be seen the two layers may have diverse properties or characteristics. Thus a choice of polymers is available. It is important, particularly in the case of solder masks where temperatures of molten solder are involved, to use 100% solids polymers, since outgassing problems exist when solvents are present, which can cause poor resolution because of gas bubbles, or undesired release of adhered surfaces. The outer liquid layer is preferably one which presents better solder mask characteristics such as environmental stability and good electrical insulation. One such photopolymer is type 311 LV from M & T Chemicals, Inc. Type 320 has advantages as the inner layer because of good adherence to bare copper conductors.

In FIGS. 2 and 3 is shown a simple clamshell type fixture for the manufacture of printed wiring boards in accordance with the teachings of this invention. Three pivotable panels, namely glass plate phototool 23 carrying panel 22, printed wiring board 20 carrying panel 21 and the clear plastic sheet 27 carrying frame 26, are pivoted about rod 24 by means of straps 25, etc. Thus, the panels 21, 22 and 26 are held to maintain precise registration when superimposed to permit the exact placement of images 29 on the phototool glass plate 23 at corresponding positions 29A and 29B respectively on the thin film 27 and the printed wiring board 20.

With the printed wiring board 20 in place on the panel 21, as disposed on the work table 40 of FIG. 3 for example, the upper surface of the printed wiring board is covered with the inner layer of liquid polymer. Similarly with the plastic film 27 resting on the phototool plate 22, a layer of polymer is deposited on the film 27 to serve as the outer layer. This outer layer while in this position is partially polymerized by means of radiation source 28 through the aperture 39 in the work surface.

The frame 26 may then be pivoted to overlay closely without contacting the printed wiring board 20 for transfer of the upper coating by squeegee in the manner shown in FIG. 1. Preferably, the squeegee blade is resilient having the order of 50 durometer hardness. Any distortions across the surface of the thin plastic sheet 27 of polyester or polyolefin parallel to the plane of the film are removable by interposing an additional flexible sheet between the resilient blade and the clear plastic sheet such as the fabric used for screen printing.

When the clear plastic film is transferred onto the surface of the printed wiring board by the use of a squeegee and an interposed sheet to absorb lateral forces the clear plastic sheet conforms to the general topology of the printed wiring conductors. After the exposure cycle, when the clear plastic sheet is peeled away the printed wiring pattern remains contoured into the plastic sheet. This contouring assists in the prevention of starvation of photopolymer from the printed wiring narrow traces, for the contours form valleys which receive additional liquid photopolymer and this additional thickness is then partially hardened by light passing through the phototool.

After the two polymer layers are mated, the glass plate phototool 22 may be pivoted into closed position to press against the air tight sealing ring 34 for evacuation by hose 32 and outlet aperture 33. The radiation source 28 may then be moved into position for exposing the two layers through the pattern on the phototool for hardening the composite polymer coating. The washout and curing then follows in the usual manner.

The phototool plate 22 is preferably a photographic glass plate of the order of 0.2 in. (0.5 cm) thick, such as availabe from Eastman Kodak Co. The plastic film carrier sheet 27 is preferably a clear polypropylene film of the order of 0.001 in. (0.0025 cm) thick, thereby providing a non-stick release surface for the cured photopolymer.

This equipment precludes the necessity for processing in an expensive and cumbersome vacuum chamber surrounding the entire array, and requiring a vacuum drawdown for each board produced. Even more important, a very expensive and precise phototool may be used without damage, wear or accumulation of dirt, etc. because of the inexpensive, reusable thin plastic film outer layer carrier surface (27) provided by this invention. It is particularly significant and critical that the employment of a plastic film carrier surface is not inconsistent with the requirement for high resolution pattern reproduction. Typically the image must be registered to an accuracy of at least 0.003 in. (0.008 cm) over a twenty inch span, a feat heretofore not feasible with a thin flexible plastic film covered with liquid polymer. Even though the plastic film does not have good dimensional stability, the accuracy of the polymer patterns is controlled by the precision glass plate phototool in this equipment, without the deterioration of the phototool in the manufacturing process as heretofore necessary when the liquid photopolymer is in surface contact with the phototool image surface.

At the conclusion of the solder mask exposure cycle, the fixture is opened, and the plastic insert film is peeled from the coated printed wiring board surface and is ready for reuse over many production cycles, typically at least 100. Those areas of unhardened photopolymer that may adhere to the plastic sheet at unhardened locations corresponding to the land areas on the printed wiring board need not be removed since they merge into the fresh layer for the next production cycle.

This apparatus may also be used advantageously for primary imaging, where a single polymer layer is deposited on the printed wiring board from the thin flexible plastic film. In this case the preferred photopolymer is CNF 1110 from M & T Chemicals, Inc. Note that the process is advantageous when holes need be tented, because of the pre-exposure step which partially polymerizes the polymer on the plastic carrier film sheet over the desired pattern areas.

It is therefore clear from the foregoing description that the state of the art is advanced by the processes and apparatus afforded by this invention, and therefore those features of novelty believed descriptive of the spirit and nature of the invention are defined with particularity in the claims.

I claim:

1. The method of producing printed circuit wiring boards having solder mask insulation thereon capable of photoimage development for establishing predetermined patterns overlying a portion of a conductive film pattern for defining electronic circuit wiring patterns adhered onto and forming ridges on an insulating substrate of the board, comprising the steps of,
   transferrring from a carrier sheet surface a liquid photopolymer layer of substantially uniform thickness in adhering contact with the surface of the printed wiring board directly over the wiring pattern ridges with the photopolymer layer thickness sufficient to cover the ridges and adhering to the surface of the board in an air free bond,
   thereafter transferring from a carrier sheet surface a covering layer of liquid photopolymer of substantially uniform thickness in an air free surface bond with the liquid photopolymer layer on the board,
   Photo exposing the two layers through a phototool having a predetermined image pattern to produce a corresponding pattern of insoluble polymer adhered to the printed wiring board thereby to establish an insulation layer over the wiring pattern,
   washing out the remaining soluble portions of the photopolymer to expose the portions of the wiring pattern uncovered by insulation, and partially pre-exposing the covering layer in position on the carrying sheet through an image pattern to harden the liquid photopolymer layer enough for improving the tenting characteristic for covering holes through the printed wiring bbard, and to cover the liquid photopolymer layer on the ridges without substantial thinning out of the photopolymer on the ridges.

2. The method defined in claim 1 wherein the liquid photopolymer layer is deposited directly on bare copper wiring traces.

3. The method of claim 1 including the step of covering the circuit ridges with a liquid photopolymer layer of at least 0.001 in. (0.0025 cm) thickness.

4. The method of claim 3 wherein the carrier sheet comprises a taut screen of a predetermined mesh determining the thickness of the liquid photopolymer layer.

5. The method of claim 1 wherein the step transferring said covering layer comprises drawing a resilient member across said sheet placed adjacent to but out of contact with the printed wiring board.

6. The method of claim 1, including the steps of affixing said carrier sheet as a thin flexible plastic film tautly held in a pivotable frame, pivoting the frame about a pivot axis into two opposed locations, and respectively mounting the covering layer on the carrier sheet and transferring the covering layer onto said liquid layer at said two opposed locations.

7. The method defined in claim 1 wherein the washing is done in two steps with two different developer solutions, the inner and outer layers being soluble in the different developer solutions, wherein the outer layer developer does not develop the inner layer and wherein the inner layer developer does not damage the outer layer, so as to reduce the degree of developer undercutting of said inner layer.

8. The method of claim 1 wherein said phototool having a predetermined image pattern additionally has a contoured lower surface to produce a corresponding contouring in said corresponding pattern of insoluble polymer adhered to the printed wiring board, including the step of contouring the surface of the covering layer with said contoured lower phototool surface.

9. The method of claim 1 further comprising the steps of,
  adhering a continuous layer of liquid photopolymer to to a carrier sheet formed by thin transparent plastic film tautly held in a frame,
  superimposing the layer of liquid photopolymer on the thin plastic film onto the printed circuit wiring board, and
  thereafter separating the plastic film from the photopolymer layer on the printed wiring board to leave the liquid photopolymer layer in place and to permit reuse of the thin plastic film to produce further photopolymer layers on further printed circuit wiring boards in subsequent cycles.

10. The method of producing printed wiring boards with conductive wiring ridges located on an insulating substrate of the printed wiring boards thereby exposing part of the substrate surface on which the ridges are located comprising the steps of coating the wiring ridges with a layer of liquid photopolymer for obtaining an air bubble free insulation coating over the printed wiring and exposed substrate with a layer of liquid photopolymer thick enough to cover the wiring ridges and the entire exposed substrate surface, overlaminating that liquid polymer layer with a further outer layer of dry film photopolymer and photo exposing the two layers through a phototool having a predetermined image pattern to produce a corresponding pattern of insoluble polymer adhered to the board to establish a solder mask insulation layer wherein said phototool having a predetermined image pattern additionally is contoured on its lower surface to produce when overlaminating a corresponding contouring in the insoluble polymer layer adhered to the printed wiring board, and contouring the surface of the covering layer with said contoured lower phototool surface.

11. The process for producing a solder mask coating on a printed wiring board having electrical conductors disposed on an insulating surface in a pattern leaving exposed only predetermined areas of printed wiring to which solder will adhere, comprising the steps of,
  coating over the printed wiring board rough contour surface configuration with a layer of a circuit trace pattern extending from the insulating surface a layer of liquid polymer adhesive of predetermined thickness overlying the electrical conductors and insulating surface free from air pockets between the layer and the rough contour board surface,
  depositing a layer of dry film solder mask polymer of predetermined thickness on a carrier surface,
  transferring said solder mask polymer layer as an outer surface layer onto the printed wiring board surface coated with liquid photopolymer in the liquid phase at ambient temperature and pressure thereby to conform with the wiring board surface configuration and forming thereby on the surface of the board two laminated layers of polymer of differing characteristics,
  exposing both said layers to a radiation source through a pattern for hardening the polymer layers in selected positions to form said solder mask and said predetermined unexposed areas to which solder will adhere,
  washing out the unhardened polymer layers, and
  curing the remaining composite coating to form the solder mask coating.

* * * * *